United States Patent [19]

Raiteri

[11] Patent Number: 4,596,500
[45] Date of Patent: Jun. 24, 1986

[54] DRILLING METHOD AND RELEVANT DRILLING MACHINE FOR STACKED BOARDS, PARTICULARLY FOR PRINTED CIRCUITS

[75] Inventor: Angelo Raiteri, Ivrea, Italy

[73] Assignee: PRT Pluritec Italia S.p.A., Burolo d'Ivrea, Italy

[21] Appl. No.: 575,829

[22] Filed: Feb. 1, 1984

[30] Foreign Application Priority Data

Feb. 17, 1983 [IT] Italy ................. 67180 A/83

[51] Int. Cl.⁴ .................. B23B 39/08; B23B 39/24; B23Q 5/36
[52] U.S. Cl. ......................... 408/3; 408/13; 408/15; 408/16; 408/67; 408/68
[58] Field of Search ............ 29/829; 408/1 R, 3, 408/13, 15, 16, 34, 43, 46, 51, 67, 68, 95, 98; 144/93 R

[56] References Cited

U.S. PATENT DOCUMENTS

| | | | |
|---|---|---|---|
| 3,120,136 | 2/1964 | Bieker | 408/1 R |
| 3,372,609 | 3/1968 | Wingne | 408/70 X |
| 3,532,893 | 10/1970 | Marantette et al. | 408/3 |
| 3,783,741 | 1/1974 | Schadebrodt et al. | 408/3 X |
| 4,269,549 | 5/1981 | Block | 408/1 R |
| 4,280,775 | 7/1981 | Wood | 408/3 |
| 4,397,074 | 8/1983 | Thornton | 408/3 X |

FOREIGN PATENT DOCUMENTS 1903564 11/1969 Fed. Rep. of Germany ......... 408/3

Primary Examiner—Gil Weidenfeld
Assistant Examiner—Steven C. Bishop
Attorney, Agent, or Firm—W. R. Hulbert

[57] ABSTRACT

To reduce dead times and waste of dummy boards necessary for preparing individual packages of stacked boards to be drilled, the latter are loaded on the table in a single stack and are drilled from the top in groups formed of a predetermined limited number of boards, drilling only partially into the next board to be drilled. The drilled boards are carried out of the stack which is reapproached to the drilling head. The drilling restarts by following the impression left by the tool in the preceding cycle on the partially drilled board. The numerically controlled drilling machine includes a table vertically movable to bring the stack against a fixed stop. A slide transversely movable after each drilling cycle engages the already drilled boards and carries them to an unloading support external to the table. The numerical control corrects for the positions of the holes upon each cycle by sensing with an optical sensor the impressions left by the tool in the preceding cycle on the partially drilled board following those unloaded.

12 Claims, 8 Drawing Figures

DRILLING METHOD AND RELEVANT DRILLING MACHINE FOR STACKED BOARDS, PARTICULARLY FOR PRINTED CIRCUITS

BACKGROUND OF THE INVENTION

The present invention relates to a drilling method and the relevant drilling machine for stacked boards, particularly for printed circuits. As it is known these boards are formed with a glass resin covered with a layer of copper and are drilled before the photoetching of the circuit metal.

In the series production, the drilling machines are normally controlled by a numerical control apparatus, provided with a program unit recording the positions of the requested holes.

The known drilling machines of the said type normally drill each time a package of some boards, generally three boards, which is prepared with the addition of two auxiliary or dummy boards, one as bottom and one as top. The bottom board is provided to allow the full drilling of the lower board of the package and therefore will be partially drilled together with the package, while the top board must be drilled too to prevent the tool, by engaging the metallic layer not covered by another board, from splintering it.

The boards of the package are mutually connected with pins, the projection of which serves as reference for positioning the package on the drilling machine. The packaging operation is previously effected, whereas the packages of boards are manually loaded on the drilling machine and unloaded after the drilling. Therefore the known drilling machines, between one drilling cycle and the other, require some very long dead times, whereby in the production of the printed circuits this operation is prolonged. Furthermore, the two dummy boards of the drilled package form wastage, generally of the order of 40% of all loaded boards, whereby the manufacture of the printed circuits is generally very expensive.

SUMMARY OF THE INVENTION

The technical problem that the invention intends to resolve resides in providing a drilling method and a corresponding drilling machine for stacked boards, wherein no previous preparation of the packages of boards to be drilled is required and the wastage of the dummy boards is eliminated almost totally.

This technical problem is solved by the drilling method according to the invention, which is characterized by the steps of predisposing in a drilling position a stack of boards in a number greater than the the group of boards to be drilled, simultaneously drilling one group of boards in the upper part of the stack, and carrying the group of so drilled boards each time out of the stack.

Such a method is implemented by the drilling machine for stacked boards according to the invention, which includes at least an operating head for drilling simultaneously a group of boards at least in a given position, a support table for the boards, and means for relatively displacing said table and said head along at least a first coordinate to enable this latter to operate cyclically in a sequence of positions of the boards, and is characterized in that said table is provided to support a number of boards greater than said group, advancing means being provided to advance at each drilling cycle said table with respect to said head along another coordinate perpendicular to said first coordinate, to enable said head to drill each time only the boards of said group.

According to a further characteristic of the invention, the drilling machine is provided with means for automatically unloading the drilled boards, comprising a member adapted to be moved at the end of each drilling cycle, in a predetermined horizontal direction for engaging an edge of the drilled boards and carrying them out of said table.

It is thus evident that the drilling cycles can follow one after the other on groups of boards of the same stack, thus drastically reducing the loading and unloading dead times and the wastage of the dummy boards.

Other characteristics of the invention will appear more clearly from the following description of a preferred embodiment, made by way of example, but not in a limiting sense.

BRIEF DESCRIPTION OF THE DRAWINGS

FIG. 5 is a front detail of the drilling machine in enlarged scale;

FIG. 6 is another front detail of the drilling machine, partially sectioned and in enlarged scale, in a working position;

DESCRIPTION OF THE PREFERRED EMBODIMENT

Figure 1:
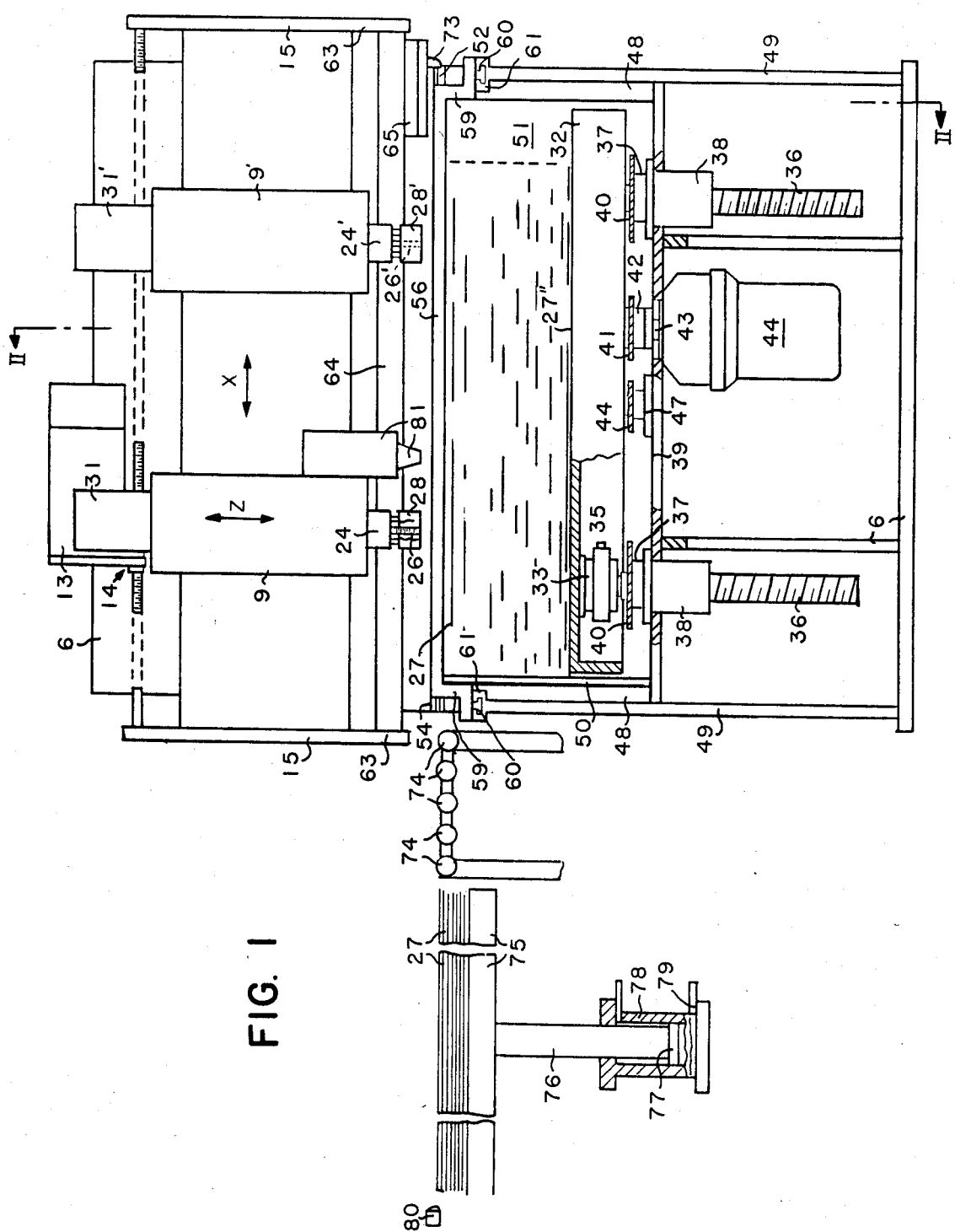
FIG. 1 is partial sectional front view of a drilling machine according to the invention.

The drilling machine according to the invention comprises a stationary frame 6 (FIG. 3) carrying a system of cross slides generically indicated by 7, on which an operating head 9 is located. In particular the system of slides 7 comprises a tranverse bar 10, on which the head 9 can slide along the X-axis, and a prismatic bar 11 connected as a T with the transverse bar 10. The bar 11 is slidable along the Y-axis on a set of bearings 12 carried by the stationary frame 6. A servomotor 13 is adapted to displace the head 9 on the bar 10, through a screw-and-female screw couple 14, the screw of which is secured on two flanks 15 of the transverse bar 10, whereas another servomotor 16 (FIG. 2) is adapted to displace the bar 11 on the bearings 12, through another screw-and-female screw couple 17.

The two servomotors 13 and 16 are controlled by a numerical control apparatus or unit 18 (FIG. 7) under the control of a program unit 19 connected thereto, which comprises a recording support, for example a magnetic tape, on which the data and the program of the drilling are recorded. The unit 18 is also connected to a keyboard 20 for the various commands of the drilling machine and for the possible recording of new programs into the unit 19. The unit 18 is also connected to a display 25 for displaying the instructions to the operator. Therefore, the unit 18 is adapted to command by numerical control the displacement of the operating head 9 (FIG. 3) along the two coordinated axes X and Y under the control of two corresponding position transducers not shown in the drawings.

The operating head 9 is substantially formed of a slide 21 (FIG. 2) which mounts a quill 22 carrying an electric motor 23 to drive a spindle 24, which engages a rotating tool 26 (FIG. 1), for example a drilling tool. The tool 26 is adapted to drill a group of support boards 27 for printed circuits. As it is known, these boards 27 are formed with a epoxy-glass material, generally with a thickness of about 1.6 mm, covered on one or both faces with a layer of copper with a thickness of 0.02 to 0.03 mm. After the drilling the copper layer is etched with photographic technics according to the layout of the circuit. The holes will allow the electric connection of points of the circuit on the two faces of the boards 27 and the insertion of integrated circuits or discrete components.

The quill 22 carries also a board pressing device 28, which includes two small cylinders adapted to be pneumatically operated by an electrovalve 29 (FIG. 7) controlled by the control unit 18, to press the upper board 27 (FIG. 2) during the drilling. Finally, located on the quill 22 is a device 30 for the suction of the debris of epoxy-glass produced by the drilling. The quill 22 is vertically displaced on the head 9 along the Z-axis by the action of a third servomotor 31, controlled as well by the control unit 18 (FIG. 7), and of a screw-and-female screw couple not shown in the drawings. Such a displacement is normally programmed in a manner that the tool 26 fully drills three stacked boards 27. Therefore the tool 26 produces each time also a partial drilling of the fourth board 27, as it will better be seen hereinafter.

The drilling machine also comprises a support table 32 (FIG. 1) for the boards 27 to be drilled. According to the invention the table 32 is vertically displaceable with respect to the stationary frame 6 and is adapted to support a stack of several half-scores of boards 27. In particular, secured to the lower surface of the table 32 are four pneumatic cylinders 33 (FIG. 4), each one cooperating with a piston 34 slidable but not rotatable on the relevant cylinder 33. For each cylinder 33 an electrovalve 35 is provided to bring in the compressed air. The four electrovalves 35 are operated by a common actuator 135 (FIG. 7) controlled by the control unit 18.

Each piston 34 (FIG. 4) is rigidly connected to a strong endless screw 36 engaged by a corresponding female screw 37. Each female screw 37 is rotatably mounted but is not axially slidable on a support 38 secured to a plate 39 of the stationary frame 6 and is rigidly connected to a toothed wheel 40. The four wheels 40 (FIG. 3) are engaged by a closed loop flexible carry member, formed of a chain 45. This latter is engaged with a toothed wheel 41 connected through a clutch 42 (FIG. 4) to a shaft 43 of a self braking reversible electric motor 44 (FIG. 1), which is secured to the plate 39. Finally, the chain 45 (FIG. 3) engages a toothed wheel 46, which is rotatable on a support 47 secured to the plate 39 in an adjustable position, in order to hold the chain 45 with a predetermined tension. By rotating the motor 44, the chain 45 rotates simultaneously the four wheels 40, together with the four female screws 37. Then these latter displace the four endless screws 36 vertically, whereby the table 32 is displaced vertically parallely to itself.

Adjustably secured to two uprights 48 of the left side 49 (FIG. 1) of the stationary frame 6 is a longitudinal reference plate 50 for the left edge of the boards 27 located on the table 32. Also adjustably secured to the two backward uprights 48 (FIG. 3) is a transverse reference plate 51 for the backward edge of the boards 27 located on the table 32. Also secured to the same uprights 48 is a cross bar 52 (FIG. 2) having one face 53 slightly greater than the overall thickness of the three boards 27 to be drilled at each drilling cycle. The cross bar 52 is also provided on the entire length with a tooth 54 for stopping upwards the stack of boards 27 to be drilled.

Located before the table 32, at the same height of the cross bar 52, is a second cross bar 56 provided on the entire length with a face 57, similar to the face 53 of the cross bar 52, and with a tooth 58 for stopping upwards the boards 27 to be drilled. In particular, the cross bar 56 is provided with two lateral projections 59 (FIGS. 3 and 6), which are secured in adjustable position each one into a groove 60 of the upper edge 61 of the relevant flank 49 of the frame 6. Therefore, the distance between the two cross bars 52 and 56 (FIG. 2) can be adjusted according to the size of the boards 27 to be drilled. The two cross bars 52 and 56 form the backward and forward guides along the X-axis of the boards 27 to be drilled.

Figure 2:
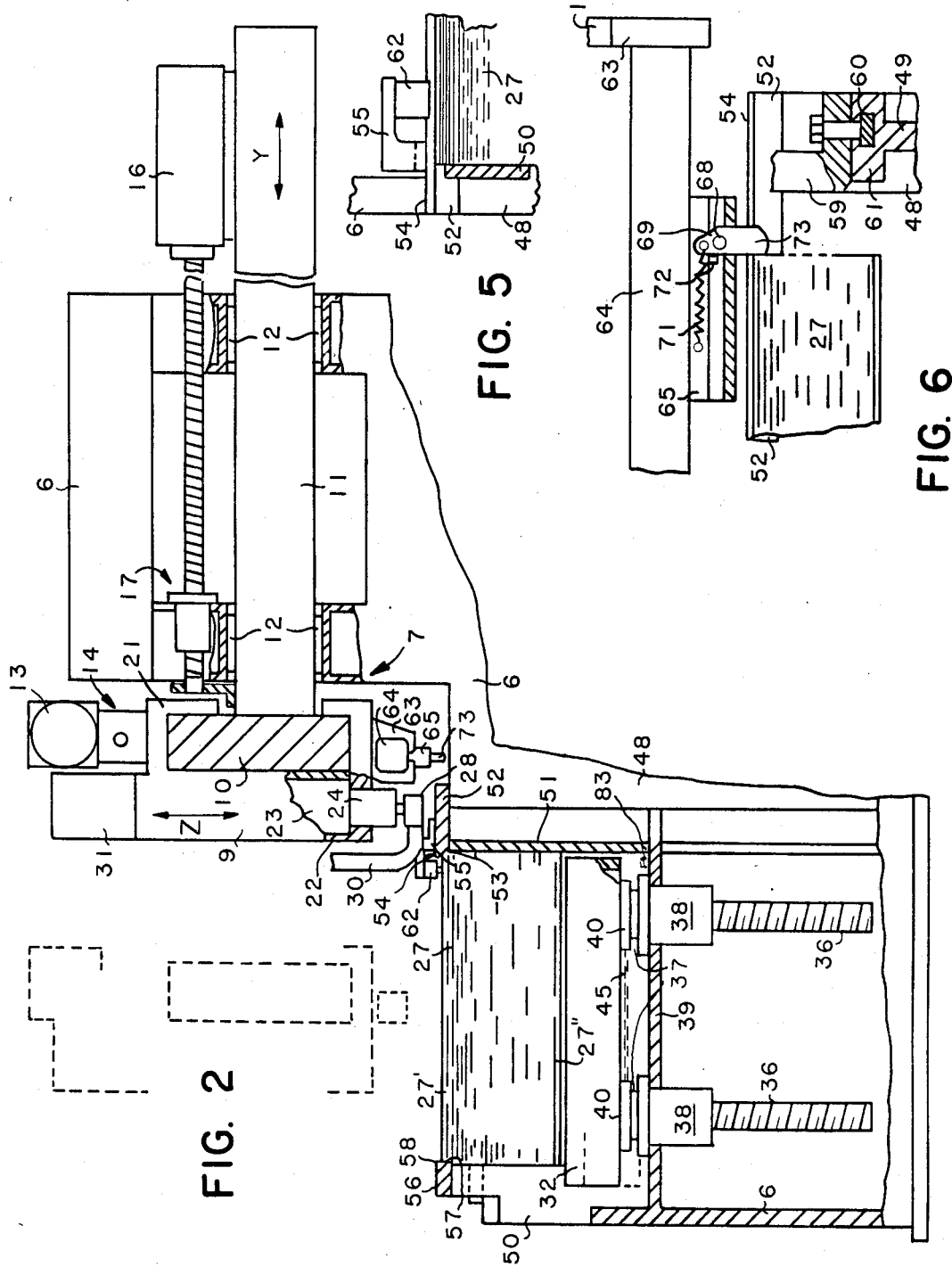
FIG. 2 is partial sectional view according to the line II—II of FIG. 1.

In the forward part of the drilling machine, the space between the lowest position of the table 32, dotted in FIG. 2, and the bar 56 is accessible from outside for loading the boards 27 to be drilled on the table 32.

Secured to the cross bar 52 is also a bracket 55 (FIGS. 2 and 5) to which a microswitch 62 located in correspondence with the tooth 54 is secured.

Figure 7:
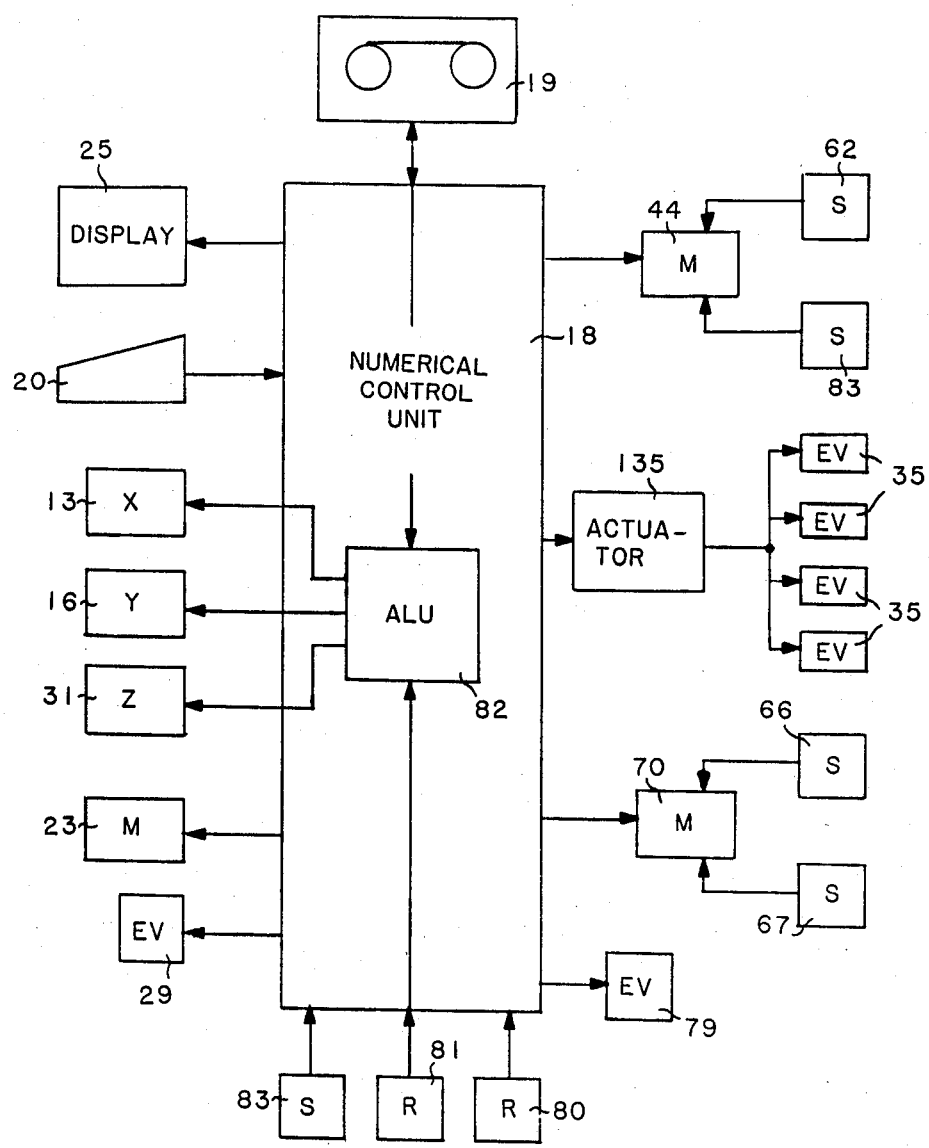
FIG. 7 is a block diagram of the control apparatus of the machine.

The direction of rotation of motor 44 is controlled by the control unit 18 (FIG. 7). When this latter controls the clockwise rotation of the motor 44 in FIG. 3, in a manner as to raise the table 32, the microswitch 62 (FIG. 2) controls the stop of the motor 44 each time it is engaged by the upper board 27 or by the table 32.

Secured to a projection 63 of the two flanks 15 (FIG. 1) of the bar 10 is also a device for unloading the drilled boards 27, which includes a hollow transverse guide 64, on which an unloading slide 65 can slide. The slide 65 is normally located on the right of the boards 27 and is operable for being displaced transversely substantially through the entire length of the table 32, by the action of a linear motor known per se, diagrammatically indicated with 70 in FIG. 7. This motor 70 is also commanded by the unit 18 under the control of two microswitches 66 and 67 located at the two ends of the guide 64.

The slide 65 (FIG. 5) is provided with a pivot 68, on which there is fulcrumed a pawl 69, normally leant by the urge of a spring 71 against a stop 72 carried by the slide 65. A projection 73 of the pawl 69 is adapted to engage the right edge of the three upmost boards 27 of the stack, when this one leans against the two teeth 54 and 58 of the cross bars 52 and 56.

Located on the left of the drilling machine is a series of rollers 74 (FIG. 1) adapted to support frictionless the drilled boards 27 which are carried by the projection 73. Located on the left of the rollers 74 is a table 75 adapted to receive the unloaded drilled boards. The table 75 is carried by a column 76 secured to a piston 77. This latter cooperates with a pneumatic cylinder 78 which serves also as a guide for the column 76. The cylinder 78 is commanded by a group of electrovalves 79 (FIG. 7) adapted to be operated under the control of the unit 18 in response to the signal given by an optical sensor 80 located at a predetermined height in correspondence with the table 75 (FIG. 1). Then the optical sensor 80 operates the electrovalves 79 in a manner as to lower the table 75 till the upper board 27 is brought at the same level of the sensor 80.

Finally secured to the quill 22 is an optical transducer 81 located at a predetermined distance on the right of the spindle 24 and adapted to detect a partial drilling, or impression, previously made on a board 27, for example the drilling of the copper layer. The transducer 81 is connected to an arithmetic and logic unit 82 (FIG. 7) included in the unit 18 and is controlled thereby for signalling, in cooperation with the position transducers associated with the servomotors 13 and 16, the coordinates of such an impression on the X and Y axes. At the beginning of a drilling cycle, the unit 82 is adapted to receive the coordinates detected by the transducer 81 and those programmed on the tape of the unit 19 for a predetermined hole position. Then the unit 82 calculates the difference between said coordinates and in the same cycle corrects with the so calculated difference the coordinates of all the hole positions programmed in the tape of the unit 19.

The operation of the drilling machine is as follows.

Figure 3:
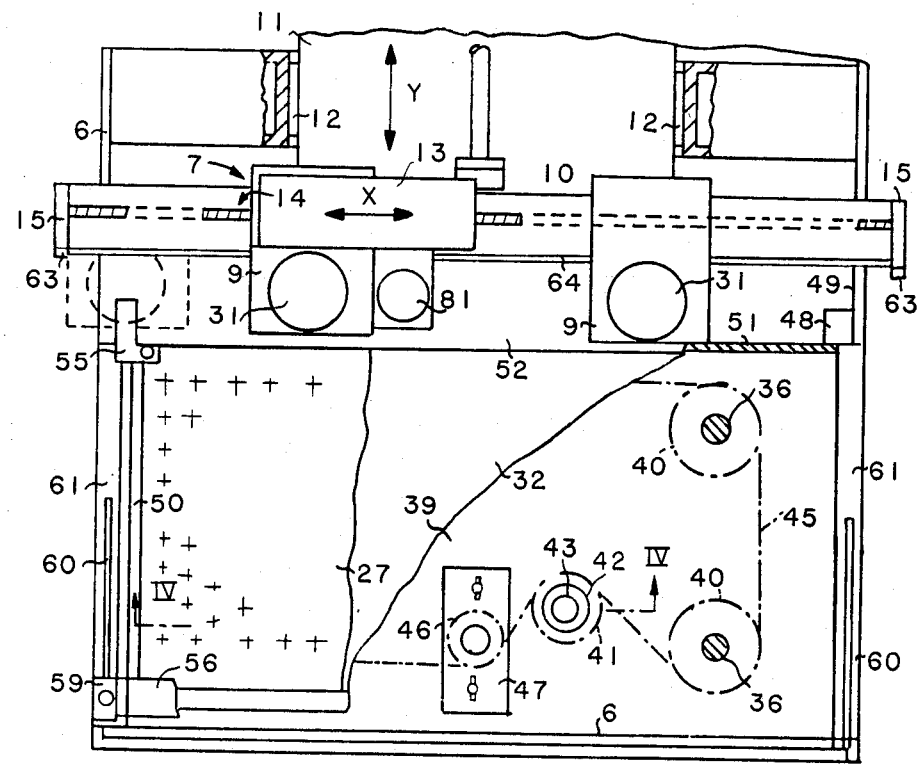
FIG. 3 is a partial sectional plan view of the drilling machine of FIG. 1.

At rest the operating head 9 lies in correspondence with the zero position, dotted in FIG. 3. In order to load a new stack of boards 27 on the table 32, the operator prepares the stack by adding only two dummy boards, an uppermost one 27' and a lowermost one 27" (FIG. 2), which may also have a lesser thickness than the others and may be devoid of the metallic layer. They must be junked since the first uppermost, if provided with the metallic layer, would be damaged in the drilling, whereas the lowermost one remains always incompletely drilled. Now the operator operates a key of the keyboard 20 (FIG. 7), which through the control unit 18 causes the motor 44 (FIG. 3) to rotate counterclockwise. The motor 44, through the wheel 41, the chain 45, the wheels 40 and the screw-and-female screw couples 36, 37 (FIG. 4) displaces the table 32 downwards. The motor 44 stops when the table 32 reaches the stroke end engaging a microswitch 83 (FIGS. 2 and 7). This latter, by opening the circuit of the motor 44, enables the self braking device to immediately stop the motor 44.

Now the operator loads the stack of boards 27, 27', 27" (FIG. 2) on the table 32 below the bar 56 and brings them till leaning leftwards against the longitudinal reference plate 50 and backwards against the transverse reference plate 51. The stack of boards 27 with the dummy boards 27' and 27" can fill the space between the table 32 and the two teeth 54 and 58. The number of boards 27 depends on their thickness, but it is of several half scores and therefore much greater than the number of boards (normally three) to be drilled in each cycle. With boards 27 with thickness of 1.6 mm, up to 150 boards 27 can be loaded on the table 32.

Figure 4:
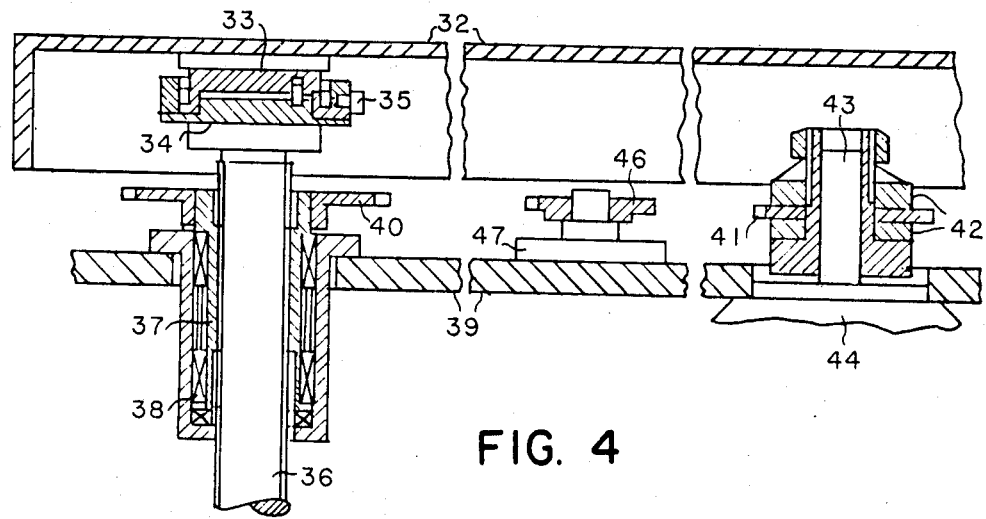
FIG. 4 is partial sectional view according to the line IV—IV of FIG. 3 in enlarged scale.

Irrespective of from the number of loaded boards 27, to start the drilling operation another key of the keyboard 20 (FIG. 7) is operated, which starts a drilling cycle. This key by means of the unit 18 causes the motor 44 to rotate clockwise (FIG. 4). The motor 44 through the chain 45 raises the table 32, till the upper board 27' engages the microswitch 62, which stops the motor 44. This operation is indicated by numeral 84 in the flow chart shown in FIG. 8. The unit 18 (FIG. 7) causes now the drilling program recorded on the tape of the unit 19 to run. At first the unit 18, through the actuator 135, operates the four eletrovalves 35 (FIG. 4), whereby the cylinders 33 are pressured. Then they bring the table 32 to press the upper board 27' with some pressure against the teeth 54 and 58 (FIG. 2) of the cross bars 52 and 56 (operation 85 in FIG. 8).

Now the unit 18 effects a logic operation 86 to state whether the first drilling cycle of the stack is starting. In affirmative case, now the unit 18 commands the motor 23 of the spindle 24 (FIG. 1). Furthermore, by reading the data recorded in the program, it alternates the positioning command of the head 9 through the servomotors 13 and 16 (operation 87 in FIG. 8) with the downward advancing of the head 9, through the servomotor 31. At first this advancing occurs in a manner as to approach the board pressing device 28 (FIG. 1) to the upper board 27' or 27 till a determined level. Then the unit 18 (FIG. 7) operates the electrovalve 29 that commands the device 28 in a manner as to press on the upper board during the drilling (operation 88 in FIG. 8).

Figure 8:
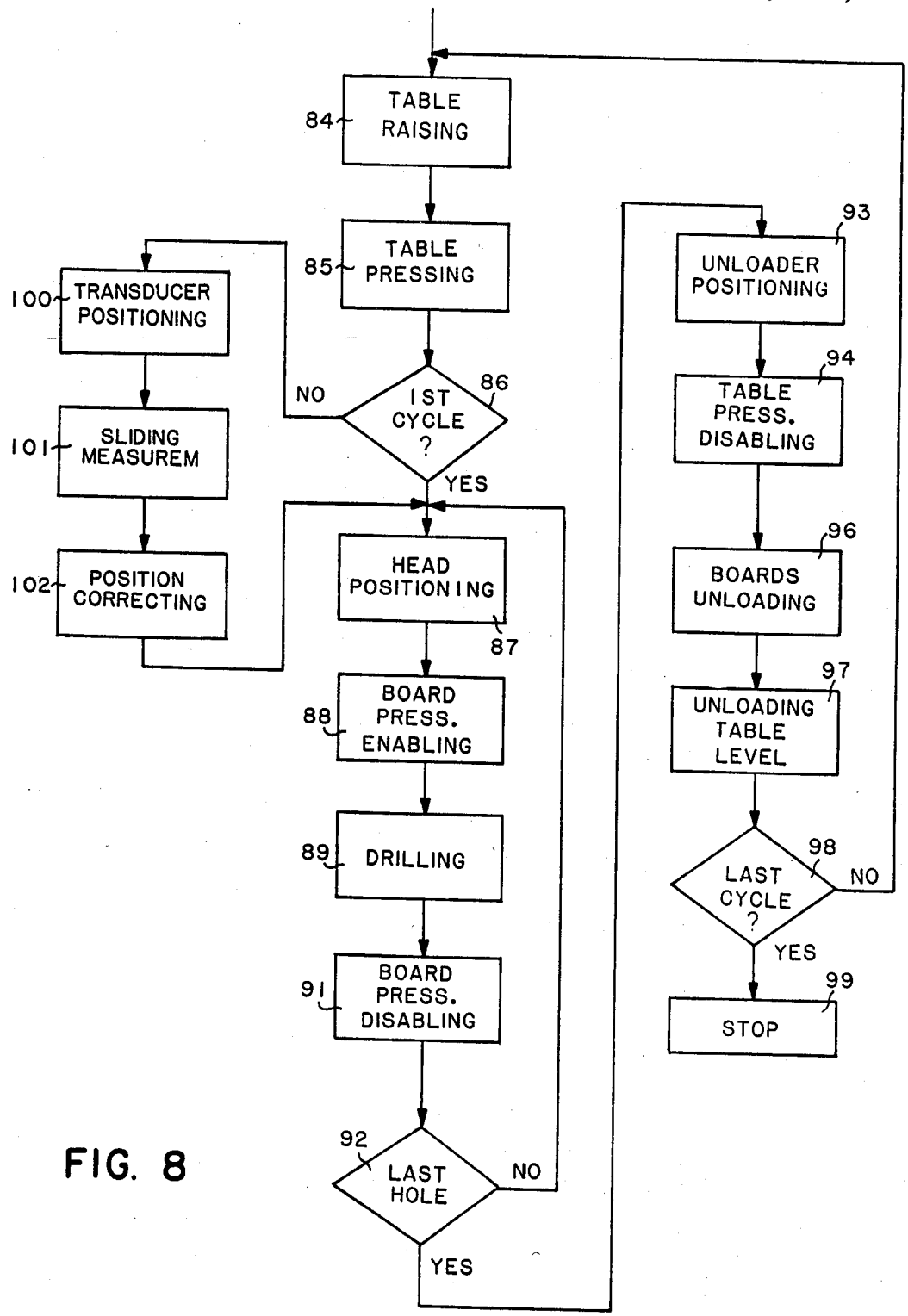
FIG. 8 is a flow chart of the operation of the drilling machine.

Then the servomotor 31 is again operated for advancing the spindle 24 in a manner to effect the true drilling (operation 89 in FIG. 8). This advancing is so controlled that the tool 26 (FIG. 1) completely drills a predetermined group of boards 27, for example three boards 27. However the tool 26 is compelled to drill partially also the fourth board 27, on which therefore the impression of the hole remains.

Subsequently through the servomotor 31, the spindle 24 is returned to the upper position, while the device 28 is disabled (operation 91 in FIG. 8). Now the unit 18 effects a logic decision 92, according to the positions of the holes recorded in the program. In the case the hole just ended is not the last one of the foreseen series, the unit 18 repeats the routine departing from the positioning operation 87 of the head 9. Thus the subsequent drilling operations of the first group of boards 27 can be effected in the predetermined sequence of positions.

After the upward return of the spindle 24 in correspondence with the last hole of the sequence, the result of the decision 92 is positive. The program unit 19 (FIG. 7) controls now the unit 18 in a manner as to bring, through the servomotor 16 (FIG. 2), the bar 10 to an intermediate position, dotted in FIG. 2 (operation 93 in FIG. 8).

Simultaneously the unit 18 (FIG. 7) disables the actuator 135, whereby the pressure within the cylinders 33 (FIG. 4), and therefore the pressure of the upper board 27 or 27' (FIG. 2) against the teeth 54 and 58, subsides (operation 94 in FIG. 8).

Subsequently the unit 18 (FIG. 7) controls the linear motor 70, whereby the slide 65 (FIG. 6) is displaced leftwards at a predetermined speed. Now the projection 73 of the pawl 69 engages the right edge of the fully drilled boards 27 (in the described case the first three boards 27 from the top), unleafing them from the stack and carrying them leftwards. Now the carried boards 27 slide on the rollers 74 (FIG. 1) and are brought onto the unloading table 75 (operation 96 in FIG. 8). The below lying boards 27 (FIG. 1) cannot follow the lower board 27 directly carried by the projection 73, because they are blocked by the plate 50.

The stroke of the slide 65 ends when this one engages the microswitch 66 (FIG. 7), which then conditions the unit 18 to operate the motor 70 in the opposite direction, whereby the slide 65 is returned to the rest position of FIG. 1. Now the slide 65 engages the microswitch 67 (FIG. 7) which stops the motor 70.

Simultaneously the unit 18, through the servomotors 13 and 16, returns the head 9 to the zero position, while under the control of the optical sensor 80 controls the electrovalves 79 causing the piston 77 (FIG. 1) to move down together with the column 76 and the table 75, in a manner as to shift the stack of drilled boards 27 to a level slightly lower than the rollers 74 (operation 97 in FIG. 8).

Now the unit 18 effects a further logic operation 98 to state whether the level of the table 32 (FIG. 1) is such as to contain at least three boards 27, in addition to the dummy board 27", that is whether the one ended has been the last drilling cycle for the stack of boards. In positive case, the unit 18 controls an operation 99 (FIG. 8) to stop the drilling machine. On the contrary, in negative case the unit 18 starts the motor 44 (FIG. 1), which raises the table 32 with the operation 84 (FIG. 8). Now the table 32 (FIG. 2) brings the partially drilled board 27 against the two stopping teeth 54 and 58. After the operation 85 (FIG. 8) for driving the pneumatic cylinders 33 (FIG. 4), now the logic operation 86 gives negative result. Now the unit 18 through the servomotors 13 and 16 controls a temporary positioning of the head 9 in such a position as to bring the optical transducer 81 in correspondence with a predetermined hole position (operation 100 in FIG. 8).

Now the unit 18 (FIG. 7) enables the transducer 81 to measure from the partial hole of the upper board 27, the possible sliding of the same board with respect to the position that it had when it was drilled (operation 101 in FIG. 8). This is followed by an operation 102 by means of which the unit 82 (FIG. 7) corrects the positions data recorded on the program unit 19 for all the positionings of the table 32 in the next following drilling cycle, which are effected with the positioning operation 87 of FIG. 8, but taking into account the possible microdisplacements of the stack or of the upper board 27 caused by the unloading of the group of boards 27 drilled in the preceding cycle.

Obviously the drilling machine can be provided also with more than one operating head. In FIGS. 1 and 3 there are shown two heads 9 and 9', which may be located at a predetermined distance on the transverse 10 and may be displaced and operated synchronously, so as to execute the predetermined sequence of holes on two different parts of the boards 27. The drilled boards 27 shall be cut subsequently, whereby two equal printed circuits can be obtained with one board drilled in one cycle of the drilling machine. Alternately, the two heads 9 and 9' can be displaced and operated independently from each other to effect two different sequences of holes on the two parts of the boards 27 of the package for each Y-coordinate, whereby two different printed circuits can be obtained with one board 27 drilled in one cycle of the drilling machine. However, in both cases the loading operation of the boards 27 is simplified with respect to the known drilling machine, wherein the operating heads are located at fixed position and require the independent positioning of the packages which are to be drilled by each head.

In any case, from the above description it becomes evident that by eliminating the loading of the packages of boards 27 at each cycle of the drilling machine and by unleafing and unloading at each cycle the drilled boards 27, the machine's productivity is enormously increased, the dummy boards to be junked at each drilling cycle are eliminated and the cost of the same boards is enormously reduced.

It is intended that various modifications and improvements can be made to the described drilling machine without departing from the scope of the invention. For example the table 32, even being vertically displaceable, can be mounted on one or two slides, while the operating head can be displaced along one coordinate or respectively can remain stationary. Alternately the vertical movement of the table can be replaced by a vertical movement of the operating head 9, the cross bars 52 and 56 (FIG. 2) and the guide 64 of the slide 65 for unloading the boards drilled at each cycle. Finally, the slide 65 can be displaced pneumatically inside the guide 64 which, by virtue of a gasket in the axial notch can form a pneumatic cylinder for a piston connected to the slide 65.

What I claim is:

1. A drilling machine for drilling boards arranged in a stack on a table, comprising
an operating head movable toward said table through a predetermined working stroke for drilling at least one board at a time on the top of the stack,
removing means for engaging the at least one drilled board and removing it from the stack, and
advancing means for relatively moving said table and said operating head one toward the other a distance equal to the thickness of the at least one removed board.

2. A drilling machine as in claim 1, including feeding means for moving said operating head toward said table for a working stroke slightly greater than the thickness of said at least one board as to partially drill with hole impressions a board next following the fully drilled board, a pair of servomotors for relatively displacing said head and said table along a pair of coordinates perpendicular to said working stroke to enable said operating head to drill holes in a sequence of locations of said at least one board, a recorded program numerically recording data of requested locations for the holes, and a numerical control apparatus responsive to said program for controlling said servomotors, and further comprising sensing means for sensing at least one of said impressions for indicating to said control apparatus the locations of the sensed impression to correct the off-set of the next board to be drilled with respect to said table, said recorded program including a routine executed by said control apparatus at the end of a drilling cycle for controlling said sensing means in correspondence with a predetermined one of said impressions.

3. A drilling machine as in claim 2, wherein said control apparatus comprises a unit for defining the difference between the locations indicated by said sensing means and corresponding locations recorded on the program, and algebraic means for supplying said servomotors for each drilling location in the next following cycle with the algebraic sum of the location data recorded in the program and of said difference.

4. A drilling machine for drilling printed circuit boards, comprising
a horizontal table for carrying a stack of said boards,
an operating head vertically movable downwards through a predetermined stroke for simultaneously drilling a topmost group of said boards,
a member for engaging one edge of the group of drilled boards,
means for moving said member in a horizontal direction for removing the engaged group of drilled boards by causing them to slide on a below lying board, and advancing means for raising said table a distance equal to the thickness of the removed group of boards.

5. A drilling machine for stacked printed circuit boards, comprising
   at least one operating head for drilling simultaneously a group of boards in a sequence of locations of the boards,
   a horizontal support table for said boards,
   displacing means for relatively displacing said table and said head along at least one horizontal coordinate to enable said head to operate cyclically in said sequence of locations of the boards, and
   means for moving said head vertically downwards to drill said group of boards, wherein the improvement includes
   advancing means operable for relatively vertically moving said table and said head,
   means operable for causing said advancing means to initially locate said table and said head at an initial distance such as to load said table with a stack of a number of boards at least twice the number of boards of said group,
   control means operable for cyclically controlling said advancing means to relatively locate said table and said head so that the uppermost board of said group is brought at a predetermined vertical distance from said head to enable said head to drill each time only the boards of an upper group of boards of the stack,
   a removing member adapted to engage simultaneously edges of all the drilled boards of the upper group, and
   moving means for moving said member along a horizontal direction for causing the group of drilled boards to slide on a board lying below said group for being removed from the stack.

6. A drilling machine as in claim 5, including mounting means for mounting said table for vertical movement, and wherein said advancing means are operated at each cycle as to raise each time said table, said control means controlling a stroke of said table according to the thickness of said group of drilled boards.

7. A drilling machine as in claim 6, wherein said advancing means comprise at least a endless screw, a female screw cooperating with said endless screw and a direct current electric motor for operating said screw, said control means including a microswitch engageable by the uppermost board of the stack for stopping said electric motor.

8. A drilling machine as in claim 7, wherein said table is connected to a plurality of endless screws cooperating with as many female screws, and including a closed loop flexible member for transmitting the rotation from said electric motor to said endless screws.

9. A drilling machine according to claim 6 including
   a receiving table located outside said support table and adapted to receive the boards removed by said member from said stack, and
   means for moving vertically said receiving table so that the top board received by said receiving table will be located slightly below the next group of boards to be removed from said support table.

10. A drilling machine as in claim 8, comprising
    stop means for postitively stopping upward movement of said stack of boards,
    a plurality of pneumatic cylinders, each one associated with one of said endless screws, each cylinder cooperating with a piston secured to the associated endless screw,
    means for simultaneously activating said pneumatic cylinders to cause said table to press said boards against said stop means during the drilling cycle, and
    means for disabling said pneumatic cylinders when said removing member engages the edges of the drilled boards.

11. A drilling machine as in claim 5, wherein said removing member is brought by a slide, and including a stationary guide for guiding said slide in said horizontal direction, said moving means including a linear motor for moving said slide along said guide.

12. A drilling machine as in claim 11, comprising stop means for positively stopping upward movement of said stack of boards, and including pressure means operating on said table as to press said boards against said stop means during the drilling cycle, and means for disabling said pressure means during the movement of said slide.

* * * * *